US007341822B2

(12) United States Patent
Van Der Sande (10) Patent No.: US 7,341,822 B2
(45) Date of Patent: Mar. 11, 2008

(54) TIME-OPTIMAL SETPOINT GENERATOR IN A LITHOGRAPHIC APPARATUS

(75) Inventor: Joris Jan Van Der Sande, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 646 days.

(21) Appl. No.: 10/765,217

(22) Filed: Jan. 28, 2004

(65) Prior Publication Data

US 2004/0166425 A1    Aug. 26, 2004

(30) Foreign Application Priority Data

Feb. 25, 2003    (EP) ................... 03075575

(51) Int. Cl.
*G03F 7/22* (2006.01)
(52) U.S. Cl. .................. 430/311; 700/63; 700/121
(58) Field of Classification Search ........... 430/311; 716/4, 21; 700/63, 121
See application file for complete search history.

(56) References Cited

U.S. PATENT DOCUMENTS

| 6,260,282 B1 | 7/2001 | Yuan et al. ............ 33/1 |
| 6,320,345 B1* | 11/2001 | Yuan et al. ............ 318/569 |
| 2001/0021009 A1 | 9/2001 | Yuan et al. ............ 355/53 |
| 2003/0014211 A1* | 1/2003 | Curey et al. ............ 702/150 |

FOREIGN PATENT DOCUMENTS

| EP | 1 422 569 A2 | 5/2004 |
| EP | 1 596 425 A1 | 11/2005 |
| JP | 09-246360 | 9/1997 |
| JP | 2000-40658 | 2/2000 |
| JP | 2000-089814 A | 3/2000 |
| WO | WO 01/88638 A2 | 11/2001 |

OTHER PUBLICATIONS

"European Search Report dated Feb. 2, 2004."
European Search Report issued for European Patent Application No. 04075556.3-2222, dated May 24, 2006.
English translation of Japanese Office Action issued in Japanese Patent Application No. 2004-047979 mailed Jan. 26, 2007.

* cited by examiner

*Primary Examiner*—Mark E. Huff
*Assistant Examiner*—Brittany Raymond
(74) *Attorney, Agent, or Firm*—Pillsbury Winthrop Shaw Pittman LLP (57) ABSTRACT

The present invention discloses a lithographic apparatus, a device manufacturing method, and a robotics system capable of specifying a trajectory to be followed by a substrate relative to a radiation beam comprising a position and/or an orientation as a function of time. The specified trajectory is characterized as a mathematical smooth function up to at least the third order which connects a first state and a second state, wherein both the first state and the second state comprise boundary values for at least the position and/or the orientation and for first and second derivatives of the position and/or orientation.

10 Claims, 7 Drawing Sheets

TIME-OPTIMAL SETPOINT GENERATOR IN A LITHOGRAPHIC APPARATUS

BACKGROUND OF THE INVENTION

This application claims priority from European Patent Application No. 03075575.5, filed Feb. 25, 2003, herein incorporated by reference in its entirety.

1. Field of the Invention

The present invention relates to lithographic apparatus and, more particularly, to a trajectory of substrate in a lithographic apparatus.

2. Description of the Related Art

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as employed herein should be broadly interpreted as referring to a mechanism that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

programmable mirror array: an example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth above.

In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus—commonly referred to as a wafer stepper—each target portion is irradiated by exposing the entire mask pattern onto the target portion in one go. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Because, typically, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, the pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Generally, in lithographic manufacturing methods, a substrate has to be moved from a first state with a certain position, velocity, acceleration, and a certain orientation, angular velocity, and angular acceleration to a second state with a certain position, velocity, and acceleration and a certain orientation, angular velocity, and angular acceleration. According to the conventional method, a trajectory can be specified comprising a position as a function of time having three continuous derivatives. The latter means that the trajectory is smooth up to the third order.

The throughput of the device manufacturing method depends, amongst others, on the particulars of the specified trajectory to be followed. At this point two conflicting requirements have to be met. On the one hand, there is a requirement of specifying a trajectory yielding a maximal throughput of the device. On the other hand, there is a requirement to be met relating to limitations of control equipment used for positioning the substrate with sufficient accuracy and stability in the radiation beam. If the latter requirement is not met there is a risk of not obtaining manufactured devices with a sufficient degree of quality. At present, there is no method or lithographic apparatus which balances the conflicting requirements in an appropriate way.

SUMMARY OF THE INVENTION

The principles of the present invention, as embodied and broadly described herein, provide for a device manufacturing method comprising providing a radiation beam using a radiation system, projecting the radiation beam onto a substrate of radiation sensitive material, specifying a trajectory comprising a position and/or an orientation as a function of time to be followed by the substrate relative to the radiation beam, wherein the trajectory is a mathematical smooth function up to at least the third order which connects a first state and a second state, and wherein both the first state and the second state comprise boundary values for at least the position and/or the orientation and for first and second derivatives of the position and/or the orientation.

The invention also relates to a computer program for specifying the trajectory for the device manufacturing method and to a lithographic projection apparatus arranged for applying the method according to the invention.

Moreover, the present invention also relates to a robotics system comprising a first movable element, a second element, a setpoint generator arranged for specifying a trajectory comprising a position and/or an orientation as a function of time to be followed by the first element relative to the second element, wherein the trajectory is a mathematical smooth function up to at least the third order which connects a first state and a second state, wherein both the first state and the second state comprise boundary values for at least the position and/or the orientation and for first and second derivatives of the position and/or the orientation, and a drive unit for moving the first element with respect to the second element according to the specified trajectory.

According to this method the substrate and the radiation beam are moved relative to each other according to the specified trajectory. This can be accomplished by either moving only the substrate or the radiation beam or by moving both the substrate and the radiation beam. However, mostly in practice, the substrate is moved according to the trajectory in the radiation beam which is stationary.

Embodiments of the invention provide a systematic way of balancing the identified conflicting requirements. As such, the method according to invention is characterized in that the method includes specifying the trajectory which provides the shortest connection in time between the first and second state, wherein the first derivative, the second derivative and the third derivative of the trajectory are bound by predetermined values.

In this way a well-defined mathematical problem is formulated yielding one and only one trajectory associated with an optimal throughput of the method while maintaining a sufficient degree of quality of the manufactured devices. Since the said predetermined values relate to the quality of the manufactured devices, the method and apparatus can efficiently and optimally be adapted to for example changing working requirements by adjusting these predetermined values accordingly. The trajectory to be followed can be calculated in real time using straightforward analytical equations. In practice, the boundary values for the second derivatives in the first and second states will often be set at zero, which simplifies the mathematical equations to be solved.

An embodiment of the method according to the invention is characterized in that the trajectory is achieved by calculating separate respective sub-trajectories for respective dimensions of the position and/or the orientation, wherein each sub-trajectory is a mathematical smooth function up to at least the third order having the shortest connection time between the first state and the second state in the concerned dimension, wherein the first derivative, the second derivative, and the third derivative of each sub-trajectory are bound by predetermined values specified for that sub-trajectory. The method also includes selecting the sub-trajectory out of the calculated sub-trajectories which has the largest connection time, prolonging the respective non-selected sub-trajectories to the connection time of the selected sub-trajectory while meeting the requirements of the respective predetermined values for the respective sub-trajectories, and generating the said trajectory by combining the selected sub-trajectory and the prolonged sub-trajectories.

By way of illustration, consider the situation where the trajectory comprises a position and an orientation. The trajectory can be 6-dimensional (three dimensions or degrees of freedom for position and three for orientation). In this case for each dimension a sub-trajectory with the shortest connection time will be calculated (total of six sub-trajectories). Then, the sub-trajectory with has the largest connection time is selected and the other sub-trajectories are prolonged to this connection time. Finally, combining the six sub-trajectories (the selected and 5 prolonged sub-trajectories) yields the 6-dimensional trajectory.

Each sub-trajectory is bound by (individual) predetermined values. For the respective dimensions of position (corresponding to the respective sub-trajectories) respective boundary values for the velocity (first derivative of position), acceleration (second derivative of position) and jerk (third derivative of position) can be specified with the predetermined values.

An additional embodiment relates to a computer program according to the invention is arranged for specifying the trajectory to be used in the method and apparatus of the invention.

A further embodiment relates to lithography apparatus and the robotics system according to the invention are characterized in that the setpoint generator is arranged for specifying the trajectory which provides the shortest connection in time between the first and second state, wherein the first derivative, the second derivative and the third derivative of the trajectory are bound by predetermined values.

Hereafter, more detailed method steps are defined for calculating sub-trajectories and for calculating prolonged sub-trajectories. Furthermore, limitations on prolonging sub-trajectories in the case of a so-called gap-crossing-move are described. With respect to these and other aspects, the figure description gives more detailed information for providing a better understanding of the invention.

BRIEF DESCRIPTION OF THE DRAWINGS

Embodiments of the invention will now be described, by way of example only, with reference to the accompanying schematic drawings in which.

DETAILED DESCRIPTION

Figure 1:
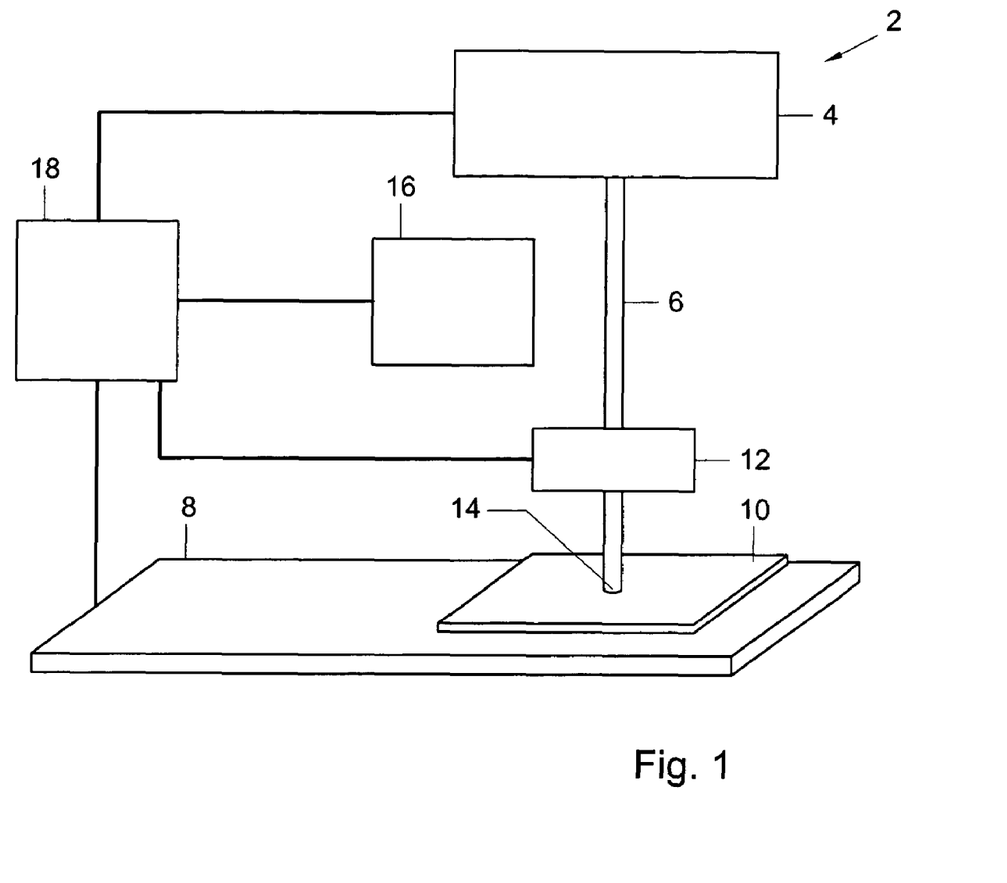
FIG. 1 schematically depicts a lithographic apparatus associated with an embodiment of the present invention.

FIG. 1 schematically depicts a lithographic apparatus 2 according to a particular embodiment of the invention. The apparatus comprises a radiation system 4 for providing a radiation beam 6. The apparatus 2 also comprises a substrate table 8 for holding a substrate 10 of radiation sensitive material, a projection system 12 for projecting the radiation beam 6 onto a target portion 14 of the substrate 10.

The apparatus 2 comprises a setpoint generator 16 for specifying a trajectory comprising a position and/or an orientation as a function of time to be followed by the substrate 10 relative to the radiation beam 6. The specified trajectory is a mathematical smooth function up to at least the third order, such that it has mathematically well-defined derivations of the position and/or orientation as a function of time up to the third order.

The first derivative of the position is the velocity, the second derivative is the acceleration and the third derivative is the jerk. The first derivative of the orientation is the angular velocity, the second derivative is the angular acceleration and the third derivative is the angular jerk. The specified trajectory connects a first state with a second state. The first state can be a begin state (defining a starting position) and the second state can be an end state of the (sub)trajectory. Both the first state and the second state comprise boundary values for the position and/or orientation as well as for first and second derivatives thereof.

The lithography apparatus also comprises a control unit 18 for moving the substrate table 8 with the substrate, the projection system 12 and/or the radiation beam according to the specified trajectory. (Although not mentioned in this specific example, the lithographic apparatus can comprise a reticle/mask which then preferably also can be moved by means of the control unit 18). Preferably the control unit 18 is provided with servo motors for moving the substrate table 8 relative to the radiation beam 6. Furthermore, the control unit in this example is provided with measurement sensors for measuring the state (the state comprising for example a position, velocity, acceleration and/or jerk, and preferably also an orientation, angular velocity, angular acceleration and/or an angular jerk) of the substrate table 8. Generally, in practice, the measurement sensors only measure the position and the orientation (angular position), wherein the derivatives are calculated from these measured values.

According to the invention, the setpoint generator 16 is arranged for specifying the trajectory which is the shortest connection in time between the first and second state, wherein the velocity, the angular velocity, the acceleration, the angular acceleration, the jerk and/or the angular jerk of the trajectory are bound by predetermined values. The predetermined values are specified in accordance with the performance figures of the control unit 18 (in particular of the servos of the control unit 18), such that the specified trajectory can be followed with sufficient accuracy. These predetermined values can for example comprise a maximum absolute velocity, a maximum absolute acceleration and a maximum absolute jerk (and in an analogous way maximum values for angular velocity and derivatives).

The trajectory preferably is determined by calculating separate respective sub-trajectories for respective dimensions of the position and/or the orientation, wherein each sub-trajectory is a mathematical smooth function up to at least the third order having the shortest connection time between the first state and the second state in the concerned dimension, wherein the first derivative, the second derivative, and the third derivative of each sub-trajectory are bound by predetermined values specified for that sub-trajectory.

The trajectory determination then selects the sub-trajectory out of the calculated sub-trajectories which has the largest connection time, prolongs the respective non-selected sub-trajectories to the connection time of the selected sub-trajectory while meeting the requirements of the respective predetermined values for the respective sub-trajectories, and generates the said trajectory by combining the selected and prolonged sub-trajectories.

The foregoing is elucidated hereafter by means of a non-limiting example for calculating a sub-trajectory which only comprises a position (with derivatives). Hereafter, the following notation is used. The position of a sub-trajectory at the time t is noted as r (or more formally r(t)), the velocity as v (or v(t)), the acceleration as a (or a(t)) and the jerk as j (or j(t)). The respective first and second states which are connected by the sub-trajectory are respectively ($r_b$, $v_b$, $a_b$, $j_b$) and ($r_e$, $v_e$, $a_e$, $j_e$). In this example, the accelerations $a_b$ and $a_e$ in the first and second states are both zero. The predetermined values for this particular sub-trajectory comprise a maximum absolute velocity V, a maximum absolute acceleration A and a maximum absolute jerk J.

For achieving a sub-trajectory of a third-order having the shortest connection time between the states the acceleration is changed as fast as possible using the maximum jerk J. An example of a trajectory having such an acceleration profile comprising three subsequent time intervals is as follows:

Maximum Jerk: j=J (building up a maximum acceleration in the shortest time possible);

Zero Jerk: j=0 (constant acceleration); and

Minimal Jerk: j=−J (decreasing the acceleration in the shortest time possible).

The time required for changing the acceleration from a=0 to a=A is A/J. Likewise the duration of changing the acceleration from a=0 to a=−A with j=−J is (−A)/(−J). For connection times T>=2A/J the acceleration profile must be trapezoid in order not to violate the absolute boundary value A for the acceleration. The corresponding acceleration profile a as a function of time t is given in the upper part of FIG. 2B, and the corresponding velocity v as a function of time t is given in the lower part of FIG. 2B.

Figure 2A:
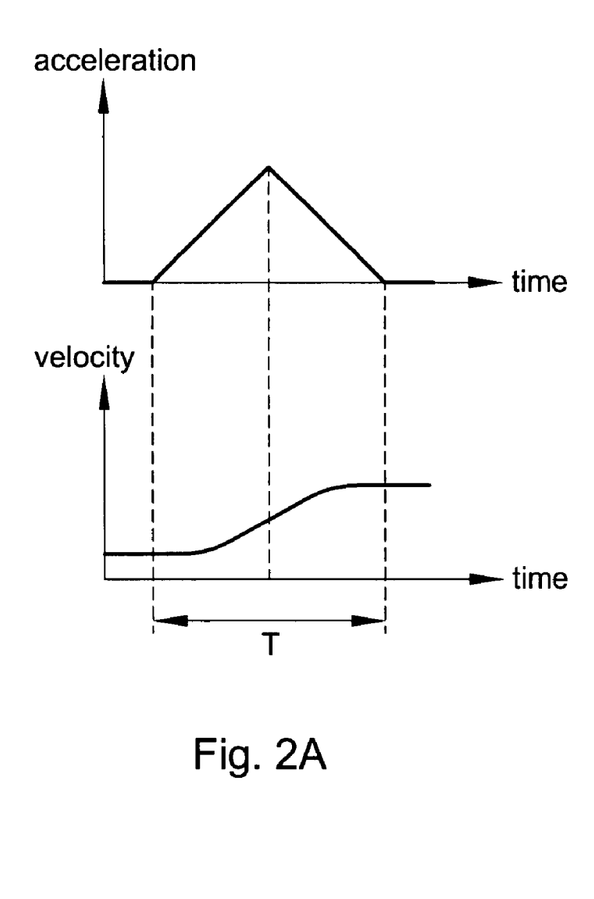
FIGS. 2A and 2B show an acceleration profile in accordance with an embodiment of the present invention.

FIG. 2A shows an acceleration profile wherein T<=2A/J. The formulas defining the position and velocity of the first state (at the start of the acceleration profile) and second state (at the end of the acceleration profile) of this profile are:

$$r_e = r_b + \int_0^T v(t)\,dt = r_b + v_b T + \frac{1}{8}kJT^3 \qquad (1)$$

$$v_e = v_b + \int_0^T a(t)\,dt = v_b + \frac{1}{4}kJT^2 \text{ wherein } a(t) \text{ is given by:} \qquad (2)$$

$$a(t) = \begin{cases} kJt & \text{if } 0 \le t \le T/2 \\ kJ(T-t) & \text{if } T/2 \le t \le T \end{cases} \qquad (3)$$

and wherein k=1 in case of a positive jerk j, wherein k=−1 in case of a negative jerk j, and wherein T is the duration in time of the whole concerning sub-trajectory.

Figure 2B:
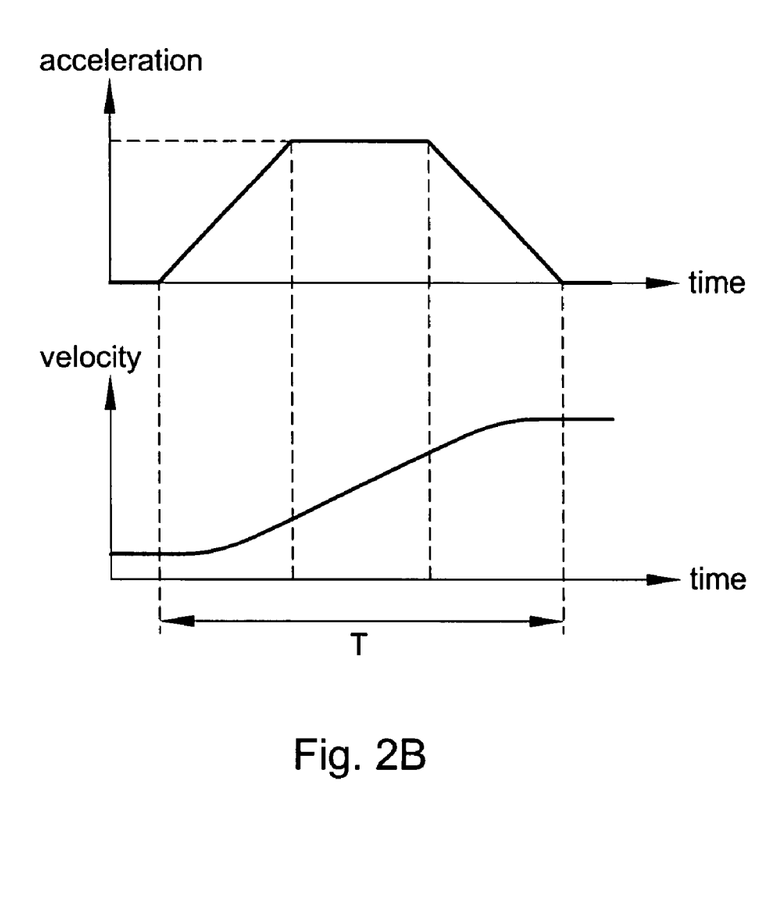

The formulas defining the position and velocity of the first and the second state of the sub-trajectory associated with FIG. 2B (under the condition T>=2A/J) are:

$$r_e = r_b + \int_0^T v(t)\,dt = r_b + v_b T + \frac{1}{2}kAT^2 - \frac{kA^2T}{2J} \qquad (4)$$

$$v_e = v_b + \int_0^T a(t)\,dt = v_b + kAT - kA^2/J \qquad (5)$$

wherein the function a(t) is given by:

$$a(t) = \begin{cases} kJt & \text{if } 0 \le t \le A/J \\ kA & \text{if } A/J \le t \le T - A/J \\ kJ(T-t) & \text{if } T - A/J \le t \le T \end{cases} \qquad (6)$$

Figure 3A:
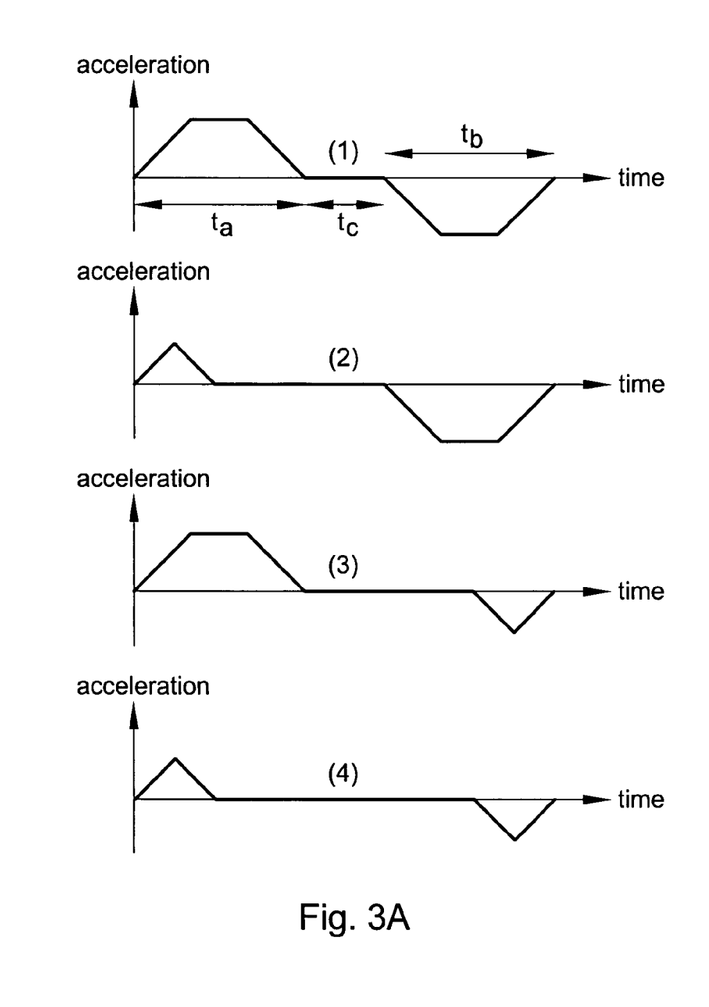
FIGS. 3A and 3B shows eight specific acceleration profiles in accordance with an embodiment of the present invention.
Figure 3B:
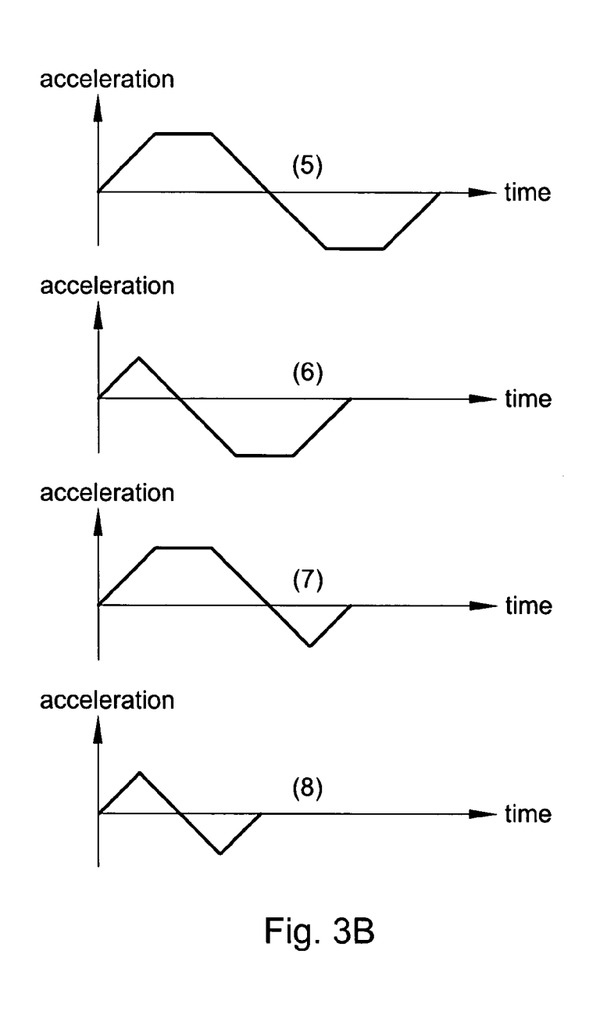

In FIGS. 3A and 3B eight respective basic acceleration profiles corresponding to eight respective basic sub-trajectories are defined. The profiles of FIG. 3A have a constant velocity part in the middle. The position as a function of time can be calculated in the same way as explained hereinbefore in relation to FIGS. 2A and 2B. On the basis of the profiles of FIGS. 3A and 3B the time optimal sub-trajectory having the shortest connection time can be determined as explained hereafter. The states comprise the boundary values for the sub-trajectory.

A method step for the detection of a possible gap-crossing-move (which method step can be used in the method according to the invention) is discussed hereafter.

Figure 4:
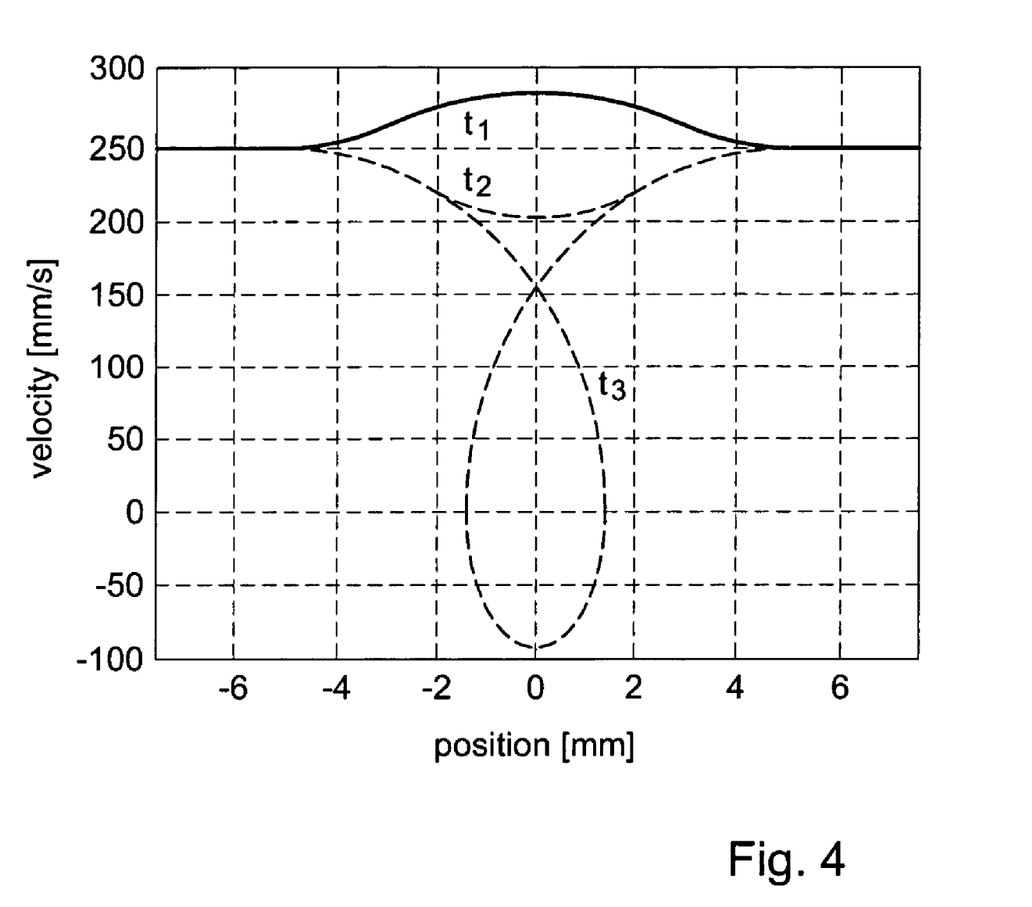
FIG. 4 shows a position-velocity diagram for a gap-crossing-move in accordance with an embodiment of the present invention.

The detection of such a gap-crossing-move can be of importance since a gap-crossing-move imposes some limitations on the possibilities of prolonging a sub-trajectory. If a gap-crossing-move is detected then, in general, two intervals with possible connection times for prolonged sub-trajectories are determined. For illustration purposes, FIG. 4 presents a position-velocity diagram of a gap-crossing move.

A gap-crossing-move is detected if the following formulas are satisfied:

$$v_b > 0 \wedge v_e > 0 \wedge r_e > r_b \qquad (7)$$

$$v_b < 0 \wedge v_e < 0 \wedge r_e < r_b \qquad (8)$$

$$|r_e - r_b| < \Delta r(v_b) + \Delta r(v_e) \qquad (9)$$

wherein the function $\Delta r(v)$ is given by:

$$\Delta r(v) = \begin{cases} |v|\sqrt{\frac{|v|}{J}} & \text{if } |v| \le A^2/J \\ \frac{1}{2}|v|\left(\frac{|v|}{A} + \frac{A}{J}\right) & \text{if } |v| \ge A^2/J \end{cases} \qquad (10)$$

wherein a gap-crossing-move is detected if either equation (7) or equation (8) is satisfied, and equation (9) is satisfied.

The detection of a possible gap-crossing-move is in particular of importance for prolonging a sub-trajectory for which a gap-crossing-move has been detected. In case of a gap-crossing-move there can be two non-overlapping intervals of possible connection times of concerned prolonged sub-trajectories: a first time interval $[t_1, t_2]$ of relatively short connection times, and a second time interval $[t_3, \text{infinity})$ with relatively long connection times.

Thus, if a gap-crossing-move has been detected for one of the sub-trajectories, and the duration of this sub-trajectory has to be prolonged such that its duration equals the duration of a sub-trajectory of the same trajectory relating to another dimension (generally the sub-trajectory of the trajectory with the longest duration time), there is a restriction in prolonging possibilities. The sub-trajectory with the gap-crossing move can not be prolonged to a connection in the time interval $[t_2, t_3]$. In the latter case the sub-trajectory must be prolonged to at least connection time $t_3$.

For calculating an optimal sub-trajectory between a first state comprising a position $r_b$, a velocity $v_b$ and zero acceleration and a second state comprising a position $r_e$, a velocity $v_e$ and zero acceleration, wherein the predetermined values are the maximum absolute velocity V, maximum absolute acceleration A and maximum absolute jerk J, the sub-trajectories associated with the acceleration profiles given in FIG. 3A are calculated first of all. If a solution is found, then this is the sub-trajectory with the shortest connection time. However, if no solution is found or a gap-crossing move is detected, then a sub-trajectory associated with one of the profiles of FIG. 3B has to be calculated for obtaining the optimal (shortest connection time) sub-trajectory.

FIG. 3A presents four acceleration profiles a(t) as a function of time which are associated with four respective sub-trajectories of the first kind. Each sub-trajectory of the first kind which has a first time interval of duration $t_a$, a subsequent second time interval of duration $t_c$ (wherein the acceleration a(t) is zero), and a subsequent third time interval $t_b$. FIG. 3B presents four respective acceleration profiles a(t) as a function of time which are associated with four respective sub-trajectories of the second kind. Each sub-trajectory of the second kind has a first time interval of duration $t_a$ and a subsequent second time interval of duration $t_b$.

The said first step for calculating a sub-trajectory of the first kind can be performed according to the following steps:

calculate a time parameter $t_c$ according to:

$$t_c = \frac{r_e - r_b - \Delta r_a - \Delta r_b}{v_i} \quad (11)$$

wherein $\Delta r_a$ and $\Delta r_b$ are given by:

$$\Delta r_a = \tfrac{1}{2}(v_b + v_i)t_a \quad (12)$$

$$\Delta r_b = \tfrac{1}{2}(v_i + v_e)t_b \quad (13)$$

wherein $v_i$ is defined by:

$$v_i = \begin{cases} -V & \text{if } r_e - r_b < 0 \\ +V & \text{if } r_e - r_b > 0 \end{cases} \quad (14)$$

wherein $t_a$ and $t_b$ are given by:

$$t_a = \begin{cases} 2\sqrt{\dfrac{|v_i - v_b|}{J}} & \text{if } |v_i - v_b| \leq A^2/J \\ \dfrac{|v_i - v_b|}{A} + \dfrac{A}{J} & \text{if } |v_i - v_b| \geq A^2/J \end{cases} \quad (15)$$

$$t_b = \begin{cases} 2\sqrt{\dfrac{|v_e - v_i|}{J}} & \text{if } |v_e - v_i| \leq A^2/J \\ \dfrac{|v_e - v_i|}{A} + \dfrac{A}{J} & \text{if } |v_e - v_i| \geq A^2/J \end{cases} \quad (16)$$

wherein, if $t_c$ is greater than zero, then a sub-trajectory of the first kind (FIG. 3A) is calculated which comprises three subsequent parts, wherein in the first part a maximum velocity is build up in the shortest time possible within the limitations of the pre-determined values, wherein in the second part, which has a duration of $t_c$, the velocity is constant and equals $v_b$ plus the velocity built up in the first part, and wherein in the third part the velocity is decreased to the velocity $v_e$ in the shortest time possible within the limitations of the pre-determined values;

wherein, if $t_c$ is less than or equal to zero, then a sub-trajectory of a second kind (FIG. 3B) is calculated which comprises two subsequent parts, wherein in the first part a velocity is build up in the shortest time possible within the limitations of the predetermined values, and wherein in the second part the velocity is decreased to the velocity $v_e$ in the shortest time possible within the limitations of the predetermined values.

In the second step, which will be performed if $t_c<0$ or if a gap-crossing-move has been detected, the calculation of the sub-trajectory of the second kind comprises calculating four respective acceleration profiles associated with four possible sub-trajectories, wherein the first profile type is associated with the first possible sub-trajectory with a connection time T which follows from the quadratic expression:

$$\left\{\tfrac{1}{2}kA\right\}T^2 + \left\{(v_e + v_b) - \tfrac{A^2}{kJ}\right\}T + \left\{-2(r_e - r_b) - \tfrac{(v_e - v_b)^2}{2kA}\right\} = 0 \quad (17)$$

wherein the quadratic expression is solved for k=1 and k=−1, and wherein the time duration of the first part $t_a$ and the time duration of the second part $t_b$ follow from:

$$t_a = \tfrac{1}{2}T + \tfrac{v_e - v_b}{2kA} \quad (18)$$

$$t_b = \tfrac{1}{2}T - \tfrac{v_e - v_b}{2kA} \quad (19)$$

wherein (17) might yield more than one mathematical solution, wherein the mathematical solutions defining the first profile type satisfy:

$$t_a \geq 2A/J \quad (20)$$

$$t_b \geq 2A/J \quad (21)$$

$$|v_i| \leq V, \quad (22)$$

wherein for the first profile type $v_i$ is given by:

$$v_i = \tfrac{1}{2}(v_b + v_e) - \tfrac{A^2}{kJ} + \tfrac{1}{2}kAT \quad (23)$$

the second profile type is associated with the second possible sub-trajectory with a time duration $t_a$ of the first part which follows from the quartic expression:

$$\left\{\tfrac{kJ^2}{32A}\right\}t_a^4 + \left\{\tfrac{kJ}{8}\right\}t_a^3 + \left\{\tfrac{v_b J}{4A} + \tfrac{kA}{8}\right\}t_a^2 + \{v_b\}t_a + \left\{\tfrac{(v_e + v_b)A}{2J} - \tfrac{v_e^2 - v_b^2}{2kA} - (r_e - r_b)\right\} = 0, \quad (24)$$

wherein:

$$k = \begin{cases} -1 & \text{if } v_e > v_b \\ +1 & \text{if } v_e < v_b \end{cases}, \quad (25)$$

and wherein the time duration $t_b$ of the second part and the velocity $v_i$ at the transition from the first to the second part follow from:

$$v_i = v_b + \tfrac{1}{4}kJt_a^2 \quad (26)$$

$$t_b = \tfrac{J}{4A}t_a^2 - \tfrac{v_e - v_b}{kA} + \tfrac{A}{J} \quad (27)$$

wherein (24) might yield more than one mathematical solution, wherein the mathematical solutions defining the second profile type satisfy:

$$0 \leq t_a \leq 2A/J \qquad (28)$$

$$t_b \geq 2A/J \qquad (29)$$

$$|v_i| \leq V \qquad (30)$$

and wherein the connection time T of the second possible sub-trajectory follows from $T=t_a+t_b$;

the third profile type is associated with the third sub-trajectory with a time duration $t_b$ of the second part which follows from the quartic expression:

$$\left\{\frac{kJ^2}{32A}\right\}t_b^4 + \left\{\frac{kJ}{8}\right\}t_b^3 + \left\{\frac{v_e J}{4A} + \frac{kA}{8}\right\}t_b^2 + \{v_e\}t_b + \left\{\frac{(v_e+v_b)A}{2J} + \frac{v_e^2 - v_b^2}{2kA} - (r_e - r_b)\right\} = 0 \qquad (31)$$

wherein:

$$k = \begin{cases} -1 & \text{if } v_e < v_b \\ +1 & \text{if } v_e > v_b \end{cases} \qquad (32)$$

and wherein the time duration $t_a$ of the first part and the velocity $v_i$ at the transition from the first to the second part follow from:

$$v_i = v_e + \tfrac{1}{4}kJt_b^2 \qquad (33)$$

$$t_a = \frac{J}{4A}t_b^2 + \frac{v_e - v_b}{kA} + \frac{A}{J} \qquad (34)$$

wherein (31) might yield more than one mathematical solution, wherein the mathematical solutions defining the third profile type satisfy:

$$t_a \geq 2A/J \qquad (35)$$

$$0 \leq t_b \leq 2A/J \qquad (36)$$

$$|v_i| \leq V \qquad (37)$$

and wherein the connection time T of the third possible sub-trajectory follows from $T=t_a+t_b$;

the fourth profile type is associated with the fourth possible sub-trajectory with a time duration T which follows from the quartic expression:

$$\left\{\frac{kJ}{16}\right\}T^4 + \{v_e + v_b\}T^2 + \{-2(r_e - r_b)\}T + \left\{-\frac{(v_e - v_b)^2}{kJ}\right\} = 0 \qquad (38)$$

wherein the quartic expression is solved for k=1 and k=−1, and wherein the time duration $t_a$ of the first part and the time duration $t_b$ of the second part and the velocity $v_i$ at the transition from the first to the second part follow from:

$$t_a = \frac{1}{2}T + 2\frac{v_e - v_b}{kJT} \qquad (39)$$

$$t_b = \frac{1}{2}T - 2\frac{v_e - v_b}{kJT} \qquad (40)$$

$$v_i = v_b + \tfrac{1}{4}kJt_a^2, \qquad (41)$$

wherein (38) might yield more than one mathematical solution, wherein the mathematical solution defining the fourth profile type satisfies:

$$0 \leq t_a \leq 2A/J \qquad (42)$$

$$0 \leq t_b \leq 2A/J \qquad (43)$$

$$|v_i| \leq V \qquad (44)$$

After performing the calculation of the possible sub-trajectories, the sub-trajectory having the shortest connection time is selected. This selected sub-trajectory is a sub-trajectory of the second kind.

In the case wherein a gap-crossing-move is detected the respective solutions resulting from the respective four groups of equations:

first group of equations (17-23); (45.I)
second group of equations (24-30); (45.II)
third group of equations (31-37); (45.III)
fourth group of equations (38-44) (45.IV)

are gathered. Next, from these solutions, a selection based on the criterion that $v_b$ and $v_i$ have the same sign is made. From the selection of solutions the corresponding sub-trajectory with the shortest connection time is established and the shortest connection time is defined as $t_1$. Also, from the selection of solutions, the corresponding sub-trajectory with the longest connection time is established and defined as $t_2$. The shortest connection time $t_1$ and the longest connection time $t_2$ define a first connection time interval [$t_1$, $t_2$] comprising possible connection times according to which the original sub-trajectory under concern can be prolonged. (It is mentioned that in principle $t_1$ can be equal to $t_2$ in specific examples).

Furthermore, in an analogous way, a selection of solutions, for which $v_b$ and $v_i$ have opposite signs, out of the respective solutions resulting from the respective groups of equations, is made. Hereafter, from the corresponding sub-trajectories, the sub-trajectory with the shortest connection time $t_3$ is of importance since the connection time $t_3$ defines a lower limit of a second connection time interval [$t_3$, ∞) comprising possible connection times according to which the original sub-trajectory can be prolonged.

In an advanced embodiment the setpoint generator is arranged for prolonging the concerned sub-trajectories to the selected sub-trajectory with the largest connection time. If the velocity $v_b$ or the velocity $v_e$ (thus the velocity in the first or second states) is zero then prolonging the concerned sub-trajectory can simply be effected by inserting a connected time interval wherein the velocity is zero. Furthermore, the step for calculating a prolonged sub-trajectory can be based on setting the maximum absolute acceleration A and/or the maximum jerk J of the predetermined values to a lower value.

Furthermore, it is also possible to prolong a sub-trajectory by lowering the velocity $v_i$, thereby increasing T, wherein the connection time T (in this example T is the time duration of the sub-trajectory) for the sub-trajectory is defined by T=$t_a+t_b+t_c$, and wherein $t_a$, $t_b$ and $t_c$ are given by (for the limitations in case of a gap-crossing-move see above):

$$t_a = \begin{cases} 2\sqrt{\dfrac{|v_i - v_b|}{J}} & \text{if } |v_i - v_b| \leq A^2/J \\ \dfrac{|v_i - v_b|}{A} + \dfrac{A}{J} & \text{if } |v_i - v_b| \geq A^2/J \end{cases} \quad (46)$$

$$t_b = \begin{cases} 2\sqrt{\dfrac{|v_e - v_i|}{J}} & \text{if } |v_e - v_i| \leq A^2/J \\ \dfrac{|v_e - v_i|}{A} + \dfrac{A}{J} & \text{if } |v_e - v_i| \geq A^2/J \end{cases} \quad (47)$$

$$t_c = \dfrac{r_e - r_b - \Delta r_a - \Delta r_b}{v_i} \quad (48)$$

$$\Delta r_a = \tfrac{1}{2}(v_b + v_i)t_a \quad (49)$$

$$\Delta r_b = \tfrac{1}{2}(v_i + v_e)t_b \quad (50)$$

Figure 5A:
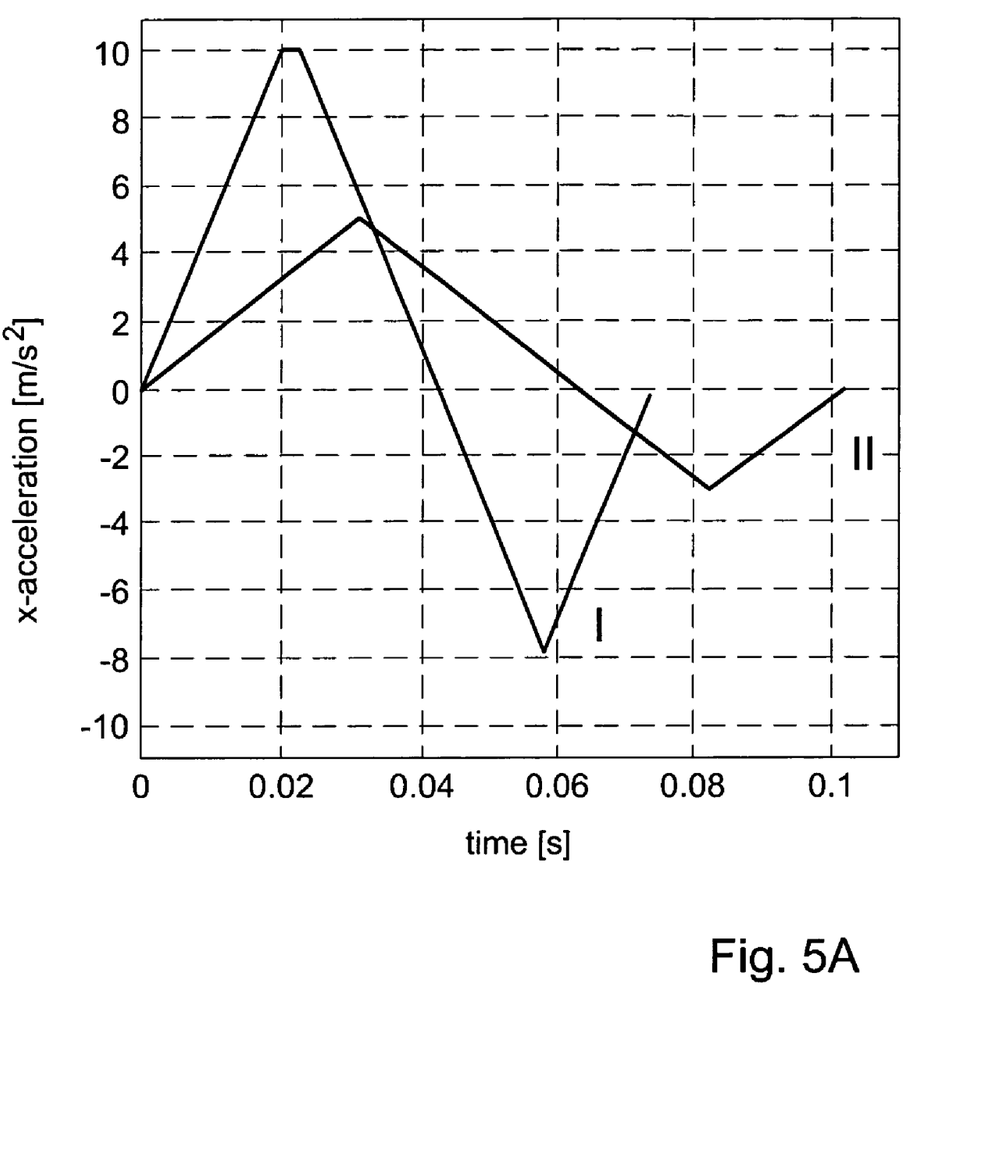
FIG. 5A shows two respective acceleration profiles corresponding to a sub-trajectory in a x-dimension and a prolonged sub-trajectory in the x-dimension in accordance with an embodiment of the present invention.
Figure 5B:
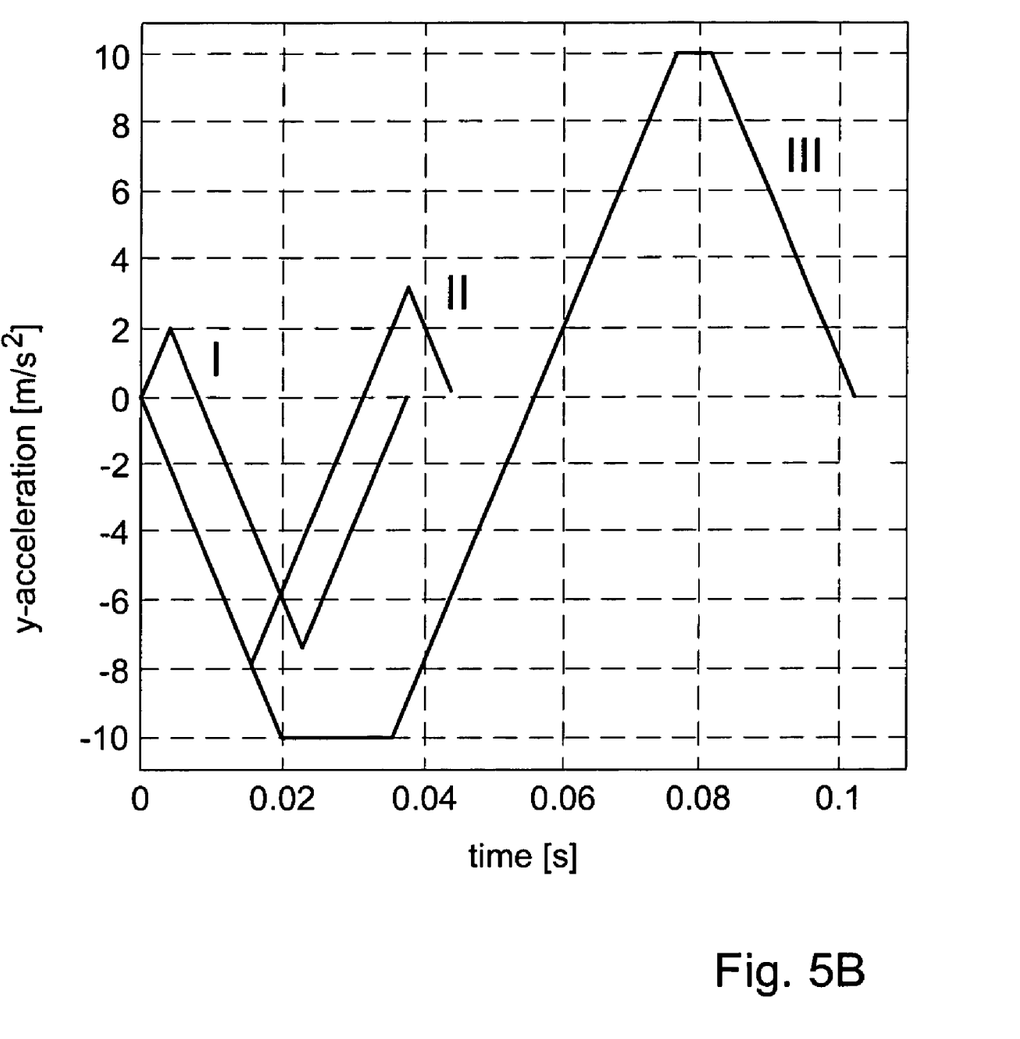
FIG. 5B shows an acceleration profile corresponding to a sub-trajectory with a gap-crossing-move and two acceleration profiles corresponding to prolonged sub-trajectories in accordance with an embodiment of the present invention.

Hereafter, the foregoing is elucidated by means of a non-limiting example:

FIGS. 5A and 5B show acceleration profiles of a servo system which comprises a x-axis (first dimension) and a y-axis (second dimension). The x-axis and y-axis are, for example, perpendicular with respect to each other. The servo system comprises an object which can be moved by servo motors of the servo system. In particular, the object can be moved independently along the x-axis and y-axis. For simplicity, in this specific example, both servos have the same characteristics: a maximum absolute velocity V of 0.5 m/s, a maximum absolute acceleration A of 10 m/s² and a maximum absolute jerk J of 500 m/s³.

In this example it is shown how the trajectory, being mathematically smooth up to the third order, having the shortest connection time between a first state and a second state with boundary values can be found. The first state comprises two positions (in both the first dimension [x-axis] and second dimension [y-axis]), two velocities, two accelerations and two jerks (thus the velocities and jerks also in the two dimensions). The first state is divided in a first x-substate for the first dimension and a first y-substate for the second dimension in order to simplify notations. In an analogous way the second state is divided in two respective substates for the respective dimensions. The first x-substate is ($r_{bx}$, $v_{bx}$, $a_{bx}$)=(0, 0, 0) and the second x-substate is ($r_{ex}$, $v_{ex}$, $a_{ex}$)=(0.01, 0.1, 0). A x-sub-trajectory in the first dimension is calculated between the first x-sub-state (begin of x-sub-trajectory) and the second x-substate (end of x-sub-trajectory). The first y-substate is ($r_{by}$, $v_{by}$, $a_{by}$)=(0, 0.3, 0) and the second y-substate is ($r_{ey}$, $v_{ey}$, $a_{ey}$)=(0.01, 0.2, 0). A y-sub-trajectory in the second dimension is calculated between the first y-sub-state (begin of y-sub-trajectory) and the second y-substate (end of y-sub-trajectory). Finally, the x- and y-sub-trajectories are combined for generating the trajectory between the first state and the second state. This is explained hereafter in more detail.

A check for a possible gap-crossing-move is made for the x-sub-trajectory in the first dimension. Since for this x-sub-trajectory neither requirement (7) nor (8) is satisfied, there is no gap-crossing move. Subsequently, a x-sub-trajectory of the first kind is tried. Equations (11) to (16) yield a negative duration $t_c$ of −0.051 seconds, which means the time-optimal x-sub-trajectory must be of the second kind. Evaluating equations (17) to (22) yields no valid solution. Nor do equations (23) to (29). Evaluating equations (30) to (36) gives one valid solution: $t_b$=0.032 s, T=0.074 s. Equations (37) to (39) yield no valid solution. The time-optimal x-sub-trajectory (thus with shortest connection time) is the mathematical solution with the lowest T.

Since only one solution was found (T=0.074 s), this must be the time-optimal x-sub-trajectory. Since the move in the x-dimension is not a gap-crossing move, the time-optimal sub-trajectory can be prolonged by any arbitrary time. FIG. 5A shows the acceleration as function of time of this time-optimal sub-trajectory (continuous-line graph indicated with number I). Also shown is an acceleration profile of a prolonged version of this sub-trajectory (dotted-line graph indicated with number II).

A check for a possible gap-crossing-move is made for the y-sub-trajectory in the second dimension. Conditions (7), (9) are satisfied, therefore the move is a gap-crossing move. Next a y-sub-trajectory of the first kind is tried. Equations (11) to (16) yield a negative duration $t_c$ of −0.047 seconds, which means the time-optimal y-sub-trajectory must be of the second kind. Evaluating equations (17) to (22) gives one valid solution: k=−1, T=0.102 s (with velocity $v_i$=−0.058 m/s at the transition from the first to the second part of the y-sub-trajectory). Evaluating equations (23) to (29) yields no valid solution. Also, equations (30) to (36) yield no valid solution. Equations (37) to (39) yield two valid solutions: k=−1, T=0.045 s (with $v_i$=0.178 m/s), and k=+1, T=0.038 s (with $v_i$=0.309 m/s).

The mathematical solution with the lowest T is the fastest y-sub-trajectory possible. Its connection-time of 0.038 seconds is denoted $t_1$. However, since this is a gap-crossing move, this y-sub-trajectory can not be prolonged by any arbitrary time. The mathematical solution with the largest T in which velocity $v_i$ has the same sign as $v_b$ or $v_e$ (i.e. positive), is the y-sub-trajectory of which the connection-time will be denoted $t_2$, in this example 0.045 seconds. The y-sub-trajectory with connection-time $t_1$ can be prolonged until its connection-time is $t_2$. Further increasing the connection-time of the y-sub-trajectory is not possible without coming to a full stop. Only if the object comes to a standstill in the direction of the y-axis, backs up a bit and accelerates again, a valid y-sub-trajectory with a longer connection-time than $t_2$ can be generated.

The mathematical solution with the lowest T in which velocity $v_i$ has the opposite sign of $v_b$ or $v_e$, that is, the solution with T=0.102 seconds, is the y-sub-trajectory of which the connection-time will be denoted $t_3$, This y-sub-trajectory can be prolonged by any arbitrary time. In conclusion, the connection-time T of the move in the y-dimension must be at least 0.038 seconds (graph of corresponding acceleration profile indicated with number I in FIG. 5B), and may not be between 0.045 and 0.102 seconds. (The acceleration profile corresponding to the y-sub-trajectory with connection time T=0.045 is indicated with number II in FIG. 5B, and the acceleration profile corresponding to the y-sub-trajectory with connection time T=0.102 is indicated with number III in FIG. 5B.)

Now the connection-time of the time-optimal multi-dimensional trajectory must be determined by selecting the fastest connection-time that is possible for all dimensions. The sub-trajectory in the x-dimension must be at least 0.074 seconds, the sub-trajectory in the y-dimension must be at least 0.038 seconds. Therefore the connection-time of the multi-dimensional trajectory should be at least 0.074 seconds. However, the move in they-dimension can not have a connection-time between 0.045 and 0.102 seconds. Therefore the connection-time of the time-optimal multi-dimensional trajectory must be 0.102 seconds.

Figure 5C:
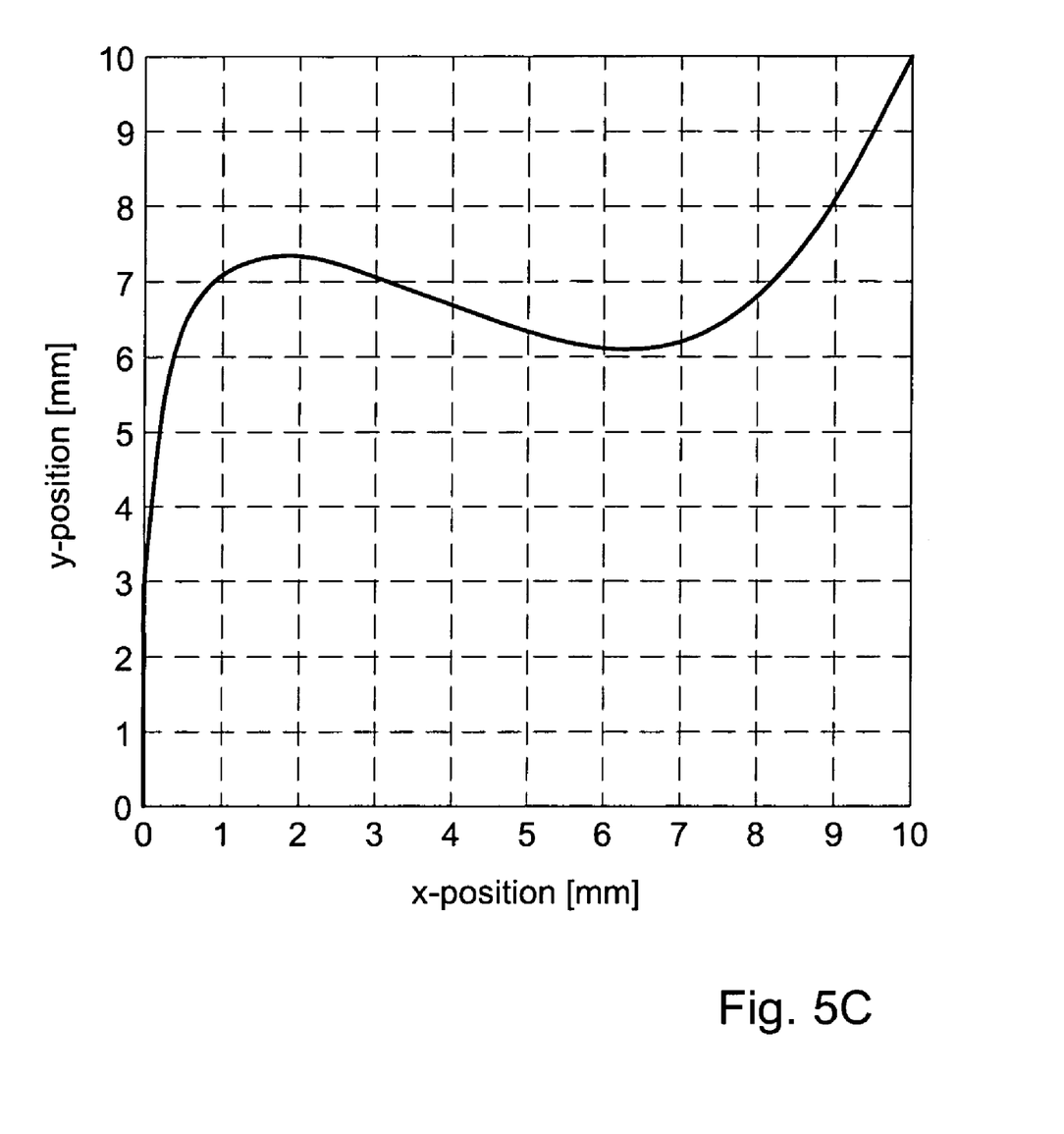
FIG. 5C shows a trajectory depicted in the x-y plane in accordance with an embodiment of the present invention.

The mathematical solution for a y-sub-trajectory with connection-time T=0.102 seconds has already been found (that is: in fact its acceleration profile which, together with the first and second y-substates, uniquely defines the y-sub-trajectory). A x-sub-trajectory with connection-time T=0.102 seconds must be created by prolonging the mathematical solution with T=0.074 seconds. In this example, this is done by lowering the jerk of this x-sub-trajectory, see FIG. 5A, graph with number II. Subsequently, the thus prolonged x-sub-trajectory can be combined with the y-sub-trajectory (which sub-trajectories now have the same time duration) yielding the desired time-optimal (shortest time duration) mathematically smooth (smooth up till order three) multi-dimensional-trajectory between the first and second states. FIG. 5C shows this trajectory in the x-y plane.

It is noted that the given examples in the description are only meant for elucidating the invention and do by no means limit the scope of the invention.

Whilst specific embodiments of the invention have been described above, it will be appreciated that the invention may be practiced otherwise than as described. The embodiments described above may, instead, be implemented in different embodiments of software, firmware, and hardware in the entities illustrated in the figures.

As such, the description and the examples included herein are not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A device manufacturing method comprising:
   providing a beam radiation;
   projecting said beam of radiation onto a substrate having radiation sensitive material; and
   specifying a trajectory to be followed by said substrate relative to said projected beam of radiation, said trajectory being characterized at least as a third order mathematical function containing information indicative of at least one of a position and an orientation as a function of time, said trajectory connecting a first state and a second state representing boundary values for said at least position and orientation and for first and second derivatives of said at least position and orientation,
   wherein said specified trajectory provides the shortest connection in time between said first and second state and wherein said first derivative, said second derivative, and a third derivative of said specified trajectory are bound by predetermined values, and
   calculating separate sub-trajectories for respective dimensions of said at least position and orientation, wherein each of said sub-trajectories is characterized at least as a third order mathematical function having the shortest connection time between said first state and said second state in the respective dimension and wherein said first derivative, said second derivative, and said third derivative of each of said sub-trajectories are bound by predetermined values specified for that sub-trajectory;
   selecting one of said sub-trajectories out of said calculated sub-trajectories based on the sub-trajectory having the largest connection time;
   prolonging non-selected sub-trajectories to the connection time of the selected sub-trajectory while meeting the requirements of the respective predetermined values for the respective sub-trajectories, and
   generating said specified trajectory by combining the selected sub-trajectory and the prolonged sub-trajectories.

2. The method of claim 1, wherein said boundary values for said second derivatives in the first and second state are zero.

3. The method of claim 1, wherein said projected beam of radiation is configured with a desired pattern in its cross-section, said desired pattern provided by a patterning device.

4. The method of claim 1, further including calculating at least one sub-trajectory between a position $r_b$, velocity $v_b$ and zero acceleration of a first state and a second position $r_e$, velocity $v_e$ and zero acceleration of the second state by:
   calculating a time parameter $t_c$ based on:

$$t_c = \frac{r_e - r_b - \Delta r_a - \Delta r_b}{v_i} \tag{F1}$$

wherein $\Delta r_a$ and $\Delta r_b$ are given by:

$$\Delta r_a = \tfrac{1}{2}(v_b + v_i)t_a \tag{F2}$$

$$\Delta r_b = \tfrac{1}{2}(v_i + v_e)t_b \tag{F3}$$

wherein $v_i$ is defined by:

$$v_i = \begin{cases} -V & \text{if } r_e - r_b < 0 \\ +V & \text{if } r_e - r_b > 0 \end{cases} \tag{F4}$$

wherein V is a predetermined value defining the maximum absolute velocity, and wherein $t_a$ and $t_b$ are given by:

$$t_a = \begin{cases} 2\sqrt{\dfrac{|v_i - v_b|}{J}} & \text{if } |v_i - v_b| \le A^2/J \\ \dfrac{|v_i - v_b|}{A} + \dfrac{A}{J} & \text{if } |v_i - v_b| \ge A^2/J \end{cases} \tag{F5}$$

$$t_b = \begin{cases} 2\sqrt{\dfrac{|v_e - v_i|}{J}} & \text{if } |v_e - v_i| \le A^2/J \\ \dfrac{|v_e - v_i|}{A} + \dfrac{A}{J} & \text{if } |v_e - v_i| \ge A^2/J \end{cases} \tag{F6}$$

wherein A is a predetermined value defining the maximum absolute acceleration of the sub-trajectory and wherein J is a predetermined value defining the maximum absolute jerk of the sub-trajectory;
wherein, if $t_c$ is greater than zero, then a sub-trajectory of a first kind comprising three parts is calculated, such that:
in the first part, a maximum velocity is built up in the shortest time $t_a$ within the limitations of said predetermined values for the sub-trajectory,
in the second part, which has a duration of $t_c$, the velocity is constant and equals $V_b$ plus the velocity built up in the first part, and
in the third part, the velocity is decreased to the velocity $V_e$ in the shortest time $t_b$ possible within the limitations of the predetermined values of the sub-trajectory; and
wherein, if $t_c$ is less than zero, a sub-trajectory of a second kind comprising two parts is calculated, such that:

in the first part, a velocity is built up in the shortest time $t_a$ possible within the limitations of the predetermined values of the sub-trajectory, and in the second part, the velocity is decreased to the velocity $v_e$ in the shortest time $t_b$ possible within the limitations of the predetermined values of the sub-trajectory.

5. The method of claim 4, further including performing a detection of a gap crossing move based on:

$$v_b > 0 \wedge v_e > 0 \wedge r_e > r_b \quad \text{(F7)}$$

$$v_b < 0 \wedge v_e < 0 \wedge r_e < r_b \quad \text{(F8)}$$

$$|r_e - r_b| < \Delta r(v_b) + \Delta r(v_e) \quad \text{(F9)}$$

wherein the function $\Delta r(v)$ is given by:

$$\Delta r(v) = \begin{cases} |v|\sqrt{\dfrac{|v|}{J}} & \text{if } |v| \le A^2/J \\ \dfrac{1}{2}|v|\dfrac{|v|}{A} + \dfrac{A}{J} & \text{if } |v| \ge A^2/J \end{cases} \quad \text{(F10)}$$

wherein a gap-crossing-move is detected if at least one of equation (F7) and equation (F8) is satisfied and equation (F9) is satisfied.

6. The method of claim 5, wherein if $t_c < 0$, or if a gap crossing move is detected, the calculation of said sub-trajectory of the second kind comprises calculating four respective types of acceleration profiles associated with four possible sub-trajectories and said selection of the sub-trajectory out of the four possible sub-trajectories which has the shortest connection time, wherein the first profile type is associated with the first possible sub-trajectory with a connection time T which follows from the quadratic expression:

$$\left\{\dfrac{1}{2}kA\right\}T^2 + \left\{(v_e + v_b) - \dfrac{A^2}{kJ}\right\}T + \left\{-2(r_e - r_b) - \dfrac{(v_e - v_b)^2}{2kA}\right\} = 0 \quad \text{(F11)}$$

wherein the quadratic expression is solved for k=1 and k=−1, and wherein the time duration of the first part $t_a$ and the time duration of the second part $t_b$ follow from:

$$t_a = \dfrac{1}{2}T + \dfrac{v_e - v_b}{2kA} \quad \text{(F12)}$$

$$t_b = \dfrac{1}{2}T - \dfrac{v_e - v_b}{2kA} \quad \text{(F13)}$$

wherein (F11) might yield more than one mathematical solution, wherein the mathematical solutions defining the first profile type satisfy:

$$t_a \ge 2A/J \quad \text{(F14)}$$

$$t_b \ge 2A/J \quad \text{(F15)}$$

$$|v_i| \ge V \quad \text{(F16)}$$

wherein for the first profile type $v_i$ is given by:

$$v_i = \dfrac{1}{2}(v_b + v_e) - \dfrac{A^2}{kJ} + \dfrac{1}{2}kAT. \quad \text{(F17)}$$

wherein the second profile type is associated with the second possible sub-trajectory with a time duration $t_a$ of the first part which follows from the quartic expression;

$$\left\{\dfrac{kJ^2}{32A}\right\}t_a^4 + \left\{\dfrac{kJ}{8}\right\}t_a^3 + \left\{\dfrac{v_b J}{4A} + \dfrac{kA}{8}\right\}t_a^2 + \\ \left\{v_b\right\}t_a + \left\{\dfrac{(v_e + v_b)A}{2J} - \dfrac{v_e^2 - v_b^2}{2kA} - (r_e - r_b)\right\} = 0 \quad \text{(F18)}$$

wherein:

$$k = \begin{cases} -1 & \text{if } v_e > v_b \\ +1 & \text{if } v_e < v_b \end{cases}, \quad \text{(F19)}$$

wherein the time duration $t_b$ of the second part and the velocity $v_i$ at the transition from the first to the second part follow from:

$$v_i = v_b + \tfrac{1}{4}kJt_a^2 \quad \text{(F20)}$$

$$t_b = \dfrac{J}{4A}t_a^2 - \dfrac{v_e - v_b}{kA} + \dfrac{A}{J} \quad \text{(F21)}$$

wherein equation (F18) might yield more than one mathematical solution, wherein the mathematical solutions defining the second profile type satisfy:

$$0 \le t_a \le 2A/J \quad \text{(F22)}$$

$$t_b \ge 2A/J \quad \text{(F23)}$$

$$|v_i| \le V \quad \text{(F24)}$$

and wherein the connection time T of the second possible sub-trajectory follows from $T = t_a + t_b$;

wherein the third profile type is associated with the third sub-trajectory with a time duration $t_b$ of the second part which follows from the quartic expression:

$$\left\{\dfrac{kJ^2}{32A}\right\}t_b^4 + \left\{\dfrac{kJ}{8}\right\}t_b^3 + \left\{\dfrac{v_e J}{4A} + \dfrac{kA}{8}\right\}t_b^2 + \\ \left\{v_e\right\}t_b + \left\{\dfrac{(v_e + v_b)A}{2J} + \dfrac{v_e^2 - v_b^2}{2kA} - (r_e - r_b)\right\} = 0, \quad \text{(F25)}$$

wherein:

$$k = \begin{cases} -1 & \text{if } v_e < v_b \\ +1 & \text{if } v_e > v_b \end{cases}, \quad \text{(F26)}$$

wherein the time duration $t_a$ of the first part and the velocity $v_i$ at the transition from the first to the second part follow from:

$$v_i = v_e + \tfrac{1}{4}kJt_b^2 \quad \text{(F27)}$$

$$t_a = \frac{J}{4A}t_b^2 + \frac{v_e - v_b}{kA} + \frac{A}{J} \quad \text{(F28)}$$

wherein (F25) might yield more than one mathematical solution, wherein the mathematical solutions defining the third profile type satisfy:

$$t_a \geq 2A/J \quad \text{(F29)}$$

$$0 \leq t_b 2A/J \quad \text{(F30)}$$

$$|v_i| \geq V \quad \text{(F31)}$$

and wherein the connection time T of the third possible sub-trajectory follows from $T=t_a=t_b$;

wherein the fourth profile type is associated with the fourth possible sub-trajectory with a time duration T which follows from the quartic expression:

$$\left\{\frac{kJ}{16}\right\}T^4 + \{v_e + v_b\}T^2 + \{-2(r_e - r_b)\}T + \left\{-\frac{(v_e - v_b)^2}{kJ}\right\} = 0 \quad \text{(F32)}$$

wherein the quartic expression is solved for $k=1$ and $k=-1$, and wherein the time duration $t_a$ of the first part and the time duration $t_b$ of the second part and the velocity $v_i$ at the transition from the first to the second part follow from:

$$t_a = \frac{1}{2}T + 2\frac{v_e - v_b}{kJT} \quad \text{(F33)}$$

$$t_b = \frac{1}{2}T - 2\frac{v_e - v_b}{kJT} \quad \text{(F34)}$$

$$v_i = v_b \frac{1}{4}kJt_a^2 \quad \text{(F35)}$$

wherein (F32) might yield more than one mathematical solution, wherein the mathematical solution defining the fourth profile type satisfies:

$$0 \geq t_a \geq 2A/J \quad \text{(F36)}$$

$$0 \geq t_b \geq 2A/J \quad \text{(F37)}$$

$$|v_i| \geq V \quad \text{(F38)}.$$

7. The method of claim 6, wherein if a gap-crossing-move is detected, then, if $v_b$ and $v_i$ have the same sign, a selection from the solutions provided by equations (F11-F17), (F18-F24), (F25-F31) and (F32-F38), respectively, is made such that the selection of the solutions define respectively the shortest connection time $t_1$ and the longest connection time $t_2$, wherein $t_1$ and $t_2$ define a first connection time interval comprising possible connection times according to which the concerning sub-trajectory can be prolonged, and wherein, if $v_b$ and $v_i$ have opposite signs, a selection of the solutions provided by equations (F11-F17), (F18-F24), (F25-F31) and (F32-F38) is made such that the selection defines a connection time $t_3$ defining a lower limit of a second connection time interval comprising possible connection times according to which the concerning sub-trajectory can be prolonged.

8. The method of claim 7, wherein calculating a prolonged sub-trajectory comprises calculating a sub-trajectory with lower predetermined value or values than the corresponding predetermined value or values of the sub-trajectory to be prolonged.

9. The method of claim 8, wherein if at least one of $v_b$ and $v_e$ equal 0, calculating a prolonged sub-trajectory comprises inserting into the sub-trajectory to be prolonged a time interval wherein the velocity is zero.

10. The method of claim 9, wherein calculating a prolonged sub-trajectory comprises lowering the velocity $v_i$ to increase T, wherein the connection time T for the sub-trajectory is defined by $T=t_a+t_b+t_c$, and wherein $t_a$, $t_b$ and $t_c$ are given by:

$$t_a = \begin{cases} 2\sqrt{\dfrac{|v_i - v_b|}{J}} & \text{if } |v_i - v_b| \leq A^2/J \\ \dfrac{|v_i - v_b|}{A} + \dfrac{A}{J} & \text{if } |v_i - v_b| \geq A^2/J \end{cases} \quad \text{(F39)}$$

$$t_b = \begin{cases} 2\sqrt{\dfrac{|v_e - v_i|}{J}} & \text{if } |v_e - v_i| \leq A^2/J \\ \dfrac{|v_e - v_i|}{A} + \dfrac{A}{J} & \text{if } |v_e - v_i| \geq A^2/J \end{cases} \quad \text{(F40)}$$

$$t_c = \frac{r_e - r_b - \Delta r_a - \Delta r_b}{v_i} \quad \text{(F41)}$$

$$\Delta r_a = \tfrac{1}{2}(v_b + v_i)t_a \quad \text{(F42)}$$

$$\Delta r_b = \tfrac{1}{2}(v_i + v_e)t_b \quad \text{(F43)}.$$

* * * * *